(12) United States Patent
Zenzai et al.

(10) Patent No.: US 9,779,876 B2
(45) Date of Patent: *Oct. 3, 2017

(54) CERAMIC ELECTRONIC COMPONENT AND METHOD FOR PRODUCING THE SAME

(71) Applicant: Murata Manufacturing Co., Ltd., Nagaokakyo-shi, Kyoto-fu (JP)

(72) Inventors: Kota Zenzai, Nagaokakyo (JP); Hisayoshi Omori, Nagaokakyo (JP); Takashi Kanayama, Nagaokakyo (JP); Kiyoyasu Sakurada, Nagaokakyo (JP); Naoki Shimizu, Nagaokakyo (JP); Seiji Katsuta, Nagaokakyo (JP); Shinji Otani, Nagaokakyo (JP)

(73) Assignee: Murata Manufactruing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/922,550

(22) Filed: Oct. 26, 2015

(65) Prior Publication Data

US 2016/0042871 A1 Feb. 11, 2016

Related U.S. Application Data

(62) Division of application No. 13/287,276, filed on Nov. 2, 2011, now Pat. No. 9,202,640.

(30) Foreign Application Priority Data

Oct. 31, 2011 (JP) ................. 2011-239241

(51) Int. Cl.
| | |
|---|---|
| *B32B 37/00* | (2006.01) |
| *B29C 65/00* | (2006.01) |
| *C03B 29/00* | (2006.01) |
| *H01G 4/30* | (2006.01) |
| *H01G 4/252* | (2006.01) |
| *H05K 3/12* | (2006.01) |

(Continued)

(52) U.S. Cl.
CPC ............... *H01G 4/30* (2013.01); *H01G 4/005* (2013.01); *H01G 4/012* (2013.01); *H01G 4/12* (2013.01);

(Continued)

(58) Field of Classification Search
CPC .......... H01G 4/30; H01G 4/005; H01G 4/012; H01G 4/252; H01G 4/12; H01G 13/006;

(Continued)

(56) References Cited

U.S. PATENT DOCUMENTS 6,171,884 B1 * 1/2001 Houda ..................... H01L 41/29
148/DIG. 138
2008/0210564 A1 * 9/2008 Motoki .................. H01G 4/012
205/122

(Continued)

OTHER PUBLICATIONS

Zenzai et al., "Ceramic Electronic Component and Manufacturing Method Thereof", U.S. Appl. No. 13/287,276, filed Nov. 2, 2011.

*Primary Examiner* — Alex Efta
(74) *Attorney, Agent, or Firm* — Keating & Bennett, LLP

(57) ABSTRACT

A ceramic body is prepared that includes an inner electrode disposed inside the ceramic body and in which an end portion of the inner electrode is led to a surface of the ceramic body. An electrode layer is formed on the surface of the ceramic body so as to cover the end portion of the inner electrode, the electrode layer containing a resin, a first metal filler that contains a first metal component, and a second metal filler that contains a second metal component having a higher melting point than the first metal component. A heating step of heating the electrode layer is performed to form an electrode including a metal layer that is located on the surface of the ceramic body and that contains the first and second metal components and a metal contained in the inner electrode.

7 Claims, 4 Drawing Sheets

(51) Int. Cl.
*H01G 4/12* (2006.01)
*H01G 13/00* (2013.01)
*H01G 4/005* (2006.01)
*H01G 4/012* (2006.01)
*H01G 4/248* (2006.01)
*H05K 3/46* (2006.01)

(52) U.S. Cl.
CPC ............ *H01G 4/248* (2013.01); *H01G 4/252* (2013.01); *H01G 13/006* (2013.01); *H05K 3/1283* (2013.01); *H05K 3/4664* (2013.01)

(58) Field of Classification Search
CPC ...... H05K 1/0215; H05K 1/0298; H05K 3/12; H05K 3/1283; H05K 3/38; H05K 3/4664
See application file for complete search history.

(56) References Cited

U.S. PATENT DOCUMENTS

| 2009/0139754 A1* | 6/2009 | Ikarashi | H01B 1/22 174/257 |
| 2009/0279229 A1* | 11/2009 | Motoki | H01G 4/005 361/321.3 |
| 2010/0282874 A1* | 11/2010 | Nakamura | H01L 41/0471 239/585.1 |
| 2014/0373324 A1* | 12/2014 | Hamanaka | H01G 4/232 29/25.42 |
| 2014/0375173 A1* | 12/2014 | Hamanaka | H01F 27/292 310/363 |

* cited by examiner

CERAMIC ELECTRONIC COMPONENT AND METHOD FOR PRODUCING THE SAME

BACKGROUND OF THE INVENTION

1. Field of the Invention

The present invention relates to a ceramic electronic component and a method for producing the ceramic electronic component.

2. Description of the Related Art

In recent years, ceramic electronic components such as monolithic ceramic capacitors have been used in harsher environments than compared with before.

Ceramic electronic components used for mobile devices such as cellular phones and portable music players are required to withstand drop impacts. Specifically, even if electronic components undergo drop impacts, it is necessary that they will not easily become detached from mount boards and that cracks will not easily form in electronic components.

Electronic components used for in-vehicle equipment such as ECUs are required to withstand the shock of a thermal cycle. Specifically, even if mount boards undergo deflection stress caused when the mount boards are subjected to thermal expansion and contraction due to a thermal cycle, it is necessary that cracks will not easily form in ceramic electronic components and solder used for mounting.

To satisfy such requirements, it has been proposed that an outer electrode containing a resin be formed using a thermosetting conductive paste instead of a conventional firing conductive paste. For example, WO2004/053901 discloses a ceramic electronic component including an outer electrode that is formed using a thermosetting conductive paste containing conductive particles with a high melting point, a metal powder with a melting point of 300° C. or lower, and a resin with a melting point of 300° C. or lower.

The ceramic electronic component disclosed in WO2004/053901 includes an outer electrode that contains a resin with high elasticity. Therefore, the ceramic electronic component disclosed in WO2004/053901 is excellent in terms of impact resistance and resistance to a thermal cycle. However, there is a problem in that the ceramic electronic component disclosed in WO2004/053901 has low moisture resistance.

SUMMARY OF THE INVENTION

Preferred embodiments of the present invention provide a ceramic electronic component with high moisture resistance.

In a method for producing a ceramic electronic component according to a preferred embodiment of the present invention, a ceramic body is prepared that includes an inner electrode disposed inside the ceramic body and in which an end portion of the inner electrode extends to a surface of the ceramic body. An electrode layer is formed on the surface of the ceramic body so as to cover the end portion of the inner electrode, the electrode layer including a resin, a first metal filler that contains a first metal component, and a second metal filler that contains a second metal component having a higher melting point than the first metal component. A heating step of heating the electrode layer is performed to form an electrode including a metal layer that is located on the surface of the ceramic body and that includes the first and second metal components and a metal included in the inner electrode.

In one aspect of the method for producing a ceramic electronic component according to a preferred embodiment of the present invention, in the heating step, the electrode layer preferably is heated to about 480° C. or higher in a non-oxidative atmosphere.

In another aspect of the method for producing a ceramic electronic component according to a preferred embodiment of the present invention, in the heating step, the electrode layer is preferably heated to a temperature of lower than about 800° C.

In still another aspect of the method for producing a ceramic electronic component according to a preferred embodiment of the present invention, in the heating step, the electrode layer is heated so that the metal layer has a protruding portion inserted into the ceramic body.

In still yet another aspect of the method for producing a ceramic electronic component according a preferred embodiment of to the present invention, the first metal component contains Sn and the second metal component contains Ag.

In still yet another aspect of the method for producing a ceramic electronic component according to a preferred embodiment of the present invention, in the heating step, the electrode layer is heated so that the metal layer has a first portion that is located on the inner electrode and that contains the first metal component and the metal contained in the inner electrode and a second portion that connects adjacent first portions to each other and that contains the first metal component and the second metal component.

In still yet another aspect of the method for producing a ceramic electronic component according to a preferred embodiment of the present invention, the first portion contains a Sn—Ni alloy and the second portion contains a Ag—Sn alloy.

In still yet another aspect of the method for producing a ceramic electronic component according to a preferred embodiment of the present invention, the inner electrode contains Ni.

A ceramic electronic component according to yet another preferred embodiment of the present invention includes a ceramic body, an inner electrode, and an outer electrode. The inner electrode is disposed inside the ceramic body. An end portion of the inner electrode extends to a surface of the ceramic body. The outer electrode is disposed on the surface of the ceramic body so as to cover the end portion of the inner electrode. The outer electrode is electrically connected to the inner electrode. The outer electrode includes a resin, a first metal component, and a second metal component having a higher melting point than the first metal component. The outer electrode includes a metal layer. The metal layer is located on the surface of the ceramic body and includes the first and second metal components and a metal included in the inner electrode.

In one aspect of the ceramic electronic component according to a preferred embodiment of the present invention, the outer electrode further includes a conductive layer that is disposed on the metal layer and that includes the first and second metal components and the resin.

In another aspect of the ceramic electronic component according to a preferred embodiment of the present invention, the metal layer includes a protruding portion extending into the ceramic body.

In still another aspect of the ceramic electronic component according to a preferred embodiment of the present invention, the first metal component contains Sn and the second metal component contains Ag.

In still yet another aspect of the ceramic electronic component according to a preferred embodiment of the present invention, the metal layer includes a first portion that is located on the inner electrode and contains the first metal component and the metal contained in the inner electrode; and a second portion that connects adjacent first portions to each other and contains the first metal component and the second metal component.

In still yet another aspect of the ceramic electronic component according to a preferred embodiment of the present invention, the first portion contains a Sn—Ni alloy and the second portion contains a Ag—Sn alloy.

In still yet another aspect of the ceramic electronic component according to a preferred embodiment of the present invention, the inner electrode contains Ni.

According to various preferred embodiments of the present invention, a ceramic electronic component with high moisture resistance is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a scanning electron micrograph obtained by observing a portion of the ceramic electronic component prepared in Experimental Example 5 at an acceleration voltage of 15.0 kV with a magnification of 5000×.

DETAILED DESCRIPTION OF THE PREFERRED EMBODIMENTS

Figure 1:
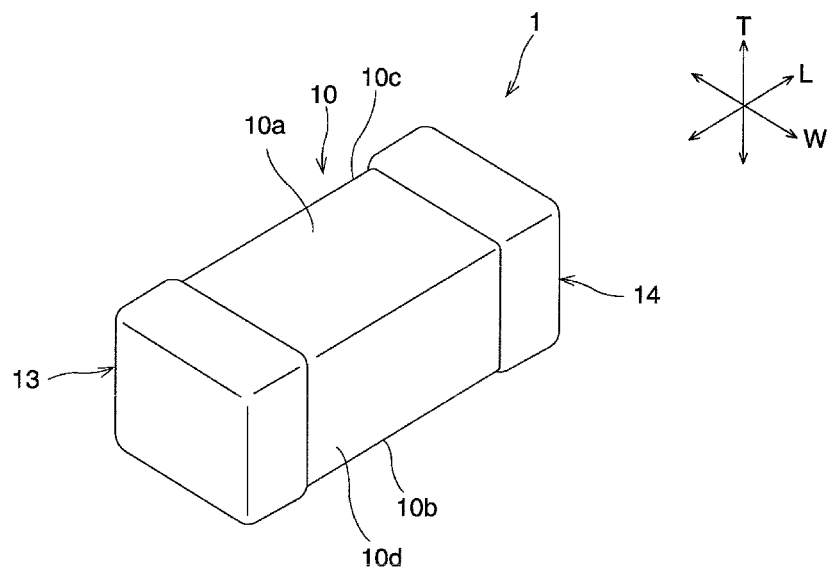
FIG. 1 is a schematic perspective view of a ceramic electronic component according to a preferred embodiment of the present invention.

Preferred embodiments of the present invention will now be described. Note that the preferred embodiments described below are merely examples. The present invention is not limited to the preferred embodiments described below.

In the drawings referred to in the description of preferred embodiments, components having substantially the same function are denoted by the same reference numerals. The drawings referred in the description of preferred embodiments are schematically described, and the size ratio of objects illustrated in the drawings may be different from that of actual objects. The size ratio of objects may also be different between the drawings. The specific size ratio of objects should be judged by taking the following description into consideration.

Figure 2:
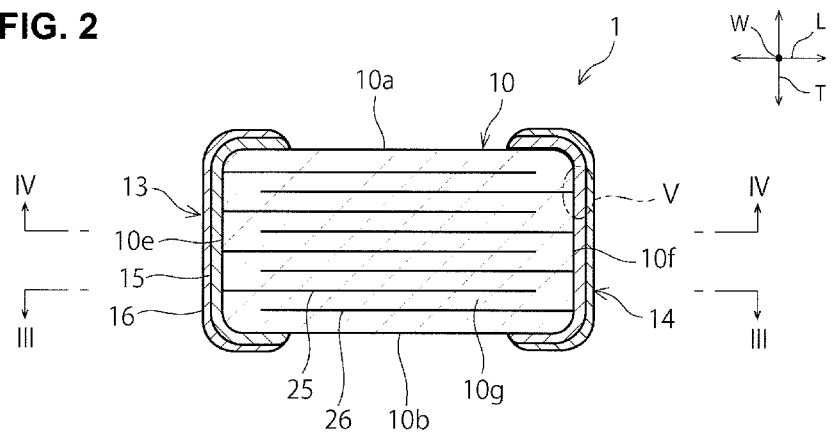
FIG. 2 is a schematic sectional view showing a cross section that extends in the length direction L and the thickness direction T of the ceramic electronic component according to a preferred embodiment of the present invention.
Figure 3:
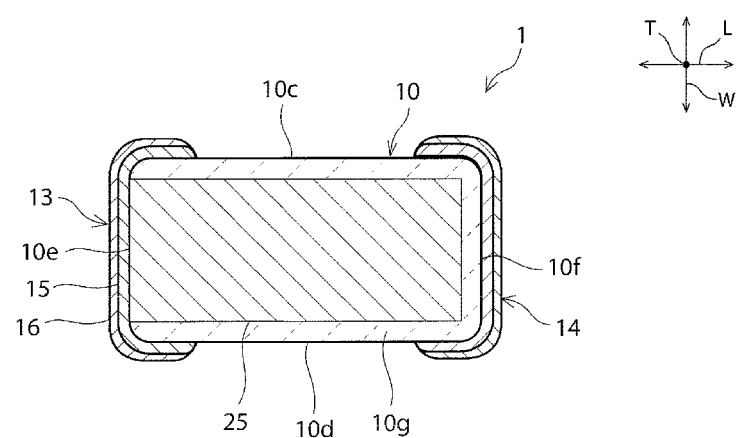
FIG. 3 is a schematic sectional view taken along line III-III of FIG. 2.
Figure 4:
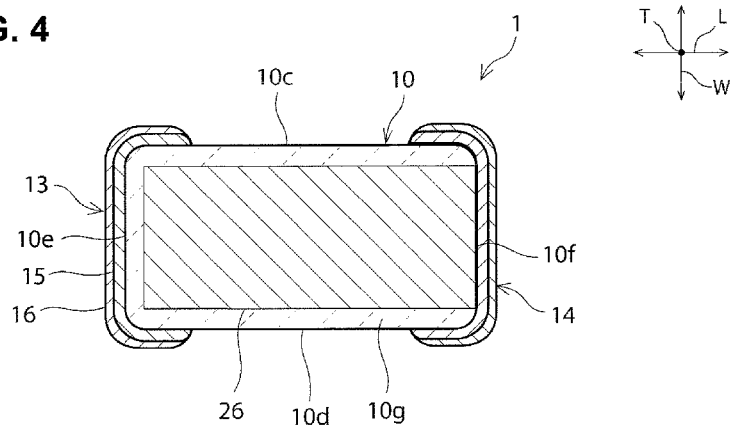
FIG. 4 is a schematic sectional view taken along line IV-IV of FIG. 2.
Figure 5:
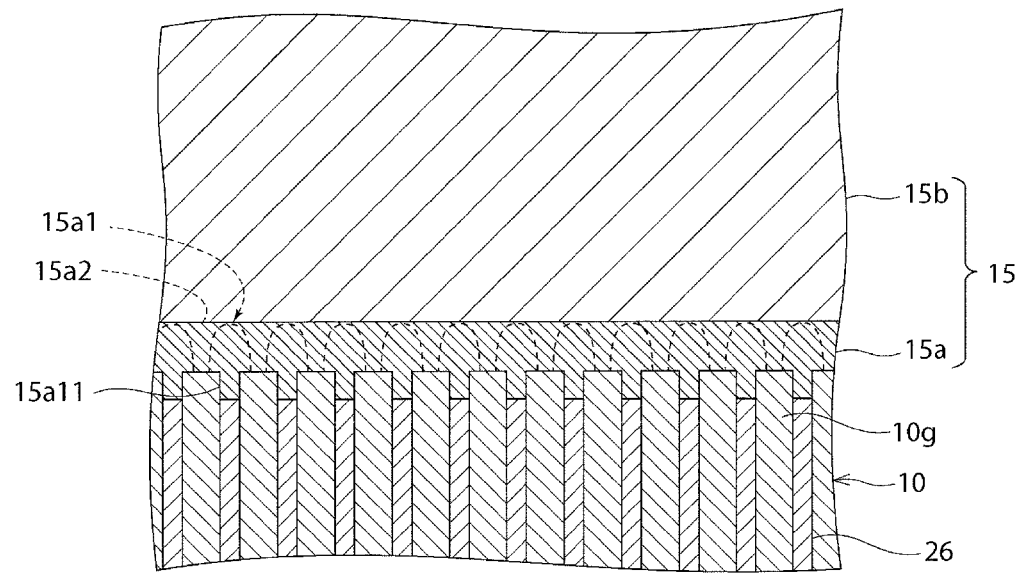
FIG. 5 is a schematic sectional view of a V portion of FIG. 2.

FIG. 1 is a schematic perspective view of a ceramic electronic component according to a preferred embodiment of the present invention. FIG. 2 is a schematic sectional view showing a cross section that extends in the length direction L and the thickness direction T of the ceramic electronic component according to the present preferred embodiment. FIG. 3 is a schematic sectional view taken along line III-III of FIG. 2. FIG. 4 is a schematic sectional view taken along line IV-IV of FIG. 2. FIG. 5 is a schematic sectional view of a V portion of FIG. 2. First, the structure of a ceramic electronic component 1 according to the present preferred embodiment will be described with reference to FIGS. 1 to 5.

The ceramic electronic component 1 includes a ceramic body 10. The ceramic body 10 preferably has a rectangular parallelepiped shape, for example. The ceramic body 10 includes first and second principal surfaces 10a and 10b that extend in the length direction L and the width direction W, first and second side surfaces 10c and 10d that extend in the thickness direction T and the length direction L, and first and second end surfaces 10e and 10f that extend in the thickness direction T and the width direction W.

In preferred embodiments of the present invention, the "rectangular parallelepiped shape" includes a rectangular parallelepiped whose corners and ridge lines are rounded. That is, a "rectangular parallelepiped" component includes any component having first and second principal surfaces, first and second side surfaces, and first and second end surfaces. Furthermore, depressions and projections may be partially or entirely formed on the principal surfaces, side surfaces, and end surfaces.

The ceramic body 10 is composed of a suitable ceramic material. The type of ceramic material constituting the ceramic body 10 can be suitably selected in accordance with desired characteristics of the ceramic electronic component 1.

For example, when the ceramic electronic component 1 is a capacitor (monolithic ceramic capacitor), the ceramic body 10 can be formed of a dielectric ceramic material. Examples of the dielectric ceramic material include $BaTiO_3$, $CaTiO_3$, $SrTiO_3$, $CaZrO_3$, $MgTiO_3$, $MgTiO_3$—$CaTiO_3$, $TiO_2$ and $BaTiO_3$—$Nd_2O_3$—$TiO_2$.

For example, when the ceramic electronic component 1 is a piezoelectric component, the ceramic body 10 can be formed of a piezoelectric ceramic material. An example of the piezoelectric ceramic material is a PZT (lead zirconate titanate) ceramic material.

For example, when the ceramic electronic component 1 is a thermistor, the ceramic body 10 can be formed of a semiconductor ceramic material. An example of the semiconductor ceramic material is a spinel-type ceramic material.

For example, when the ceramic electronic component 1 is an inductor, the ceramic body 10 can be formed of a magnetic ceramic material. An example of the magnetic ceramic material is a ferrite ceramic material.

As shown in FIGS. 2 to 4, inside the ceramic body 10, a plurality of first and second inner electrodes 25 and 26 each having a substantially rectangular shape are alternately arranged at regular intervals in the thickness direction T. The first and second inner electrodes 25 and 26 are parallel or substantially parallel to the first and second principal surfaces 10a and 10b. In the thickness direction T, the first and second inner electrodes 25 and 26 face each other with a ceramic layer 10g therebetween. The thickness of the ceramic layer 10g is, for example, preferably about 0.5 μm to about 10 μm.

The end portions of the first and second inner electrodes 25 and 26 are led to the surface of the ceramic body 10. Specifically, the first inner electrode 25 is exposed on the first end surface 10e, and is not exposed on the first and second principal surfaces 10a and 10b, the second end surface 10f, and the first and second side surfaces 10c and 10d. The second inner electrode 26 is exposed on the second end surface 10f, and is not exposed on the first and second principal surfaces 10a and 10b, the first end surface 10e, and the first and second side surfaces 10c and 10d. Specifically, the end portions of the first and second inner electrodes 25 and 26 are slightly depressed from the first and second end surfaces 10e and 10f, respectively.

The first and second inner electrodes 25 and 26 can be composed of a suitable conductive material, e.g., a metal such as Ni, Cu, Ag, Pd, or Au or an alloy containing at least one of the foregoing metals, such as a Ag—Pd alloy. In particular, the first and second inner electrodes 25 and 26 preferably contain Ni. Specifically, the first and second inner electrodes 25 and 26 are preferably composed of, for example, Ni or a Ni-containing alloy such as Ni—Cu.

The thicknesses of the first and second inner electrodes 25 and 26 are, for example, each preferably about 0.2 µm to about 2.0 µm.

First and second outer electrodes 13 and 14 are disposed on the surface of the ceramic body 10. Specifically, the first outer electrode 13 is disposed so as to cover the first end surface 10e on which the first inner electrode 25 is exposed. The first outer electrode 13 is disposed so as to reach the first and second principal surfaces 10a and 10b and the first and second side surfaces 10c and 10d. The first outer electrode 13 is electrically connected to the first inner electrode 25.

The second outer electrode 14 is disposed so as to cover the second end surface 10f on which the second inner electrode 26 is exposed. The second outer electrode 14 is disposed so as to reach the first and second principal surfaces 10a and 10b and the first and second side surfaces 10c and 10d. The second outer electrode 14 is electrically connected to the second inner electrode 26.

The first and second outer electrodes 13 and 14 each include a first conductive layer 15 and a second conductive layer 16. The first conductive layer 15 is disposed directly on the surface of the ceramic body 10. Specifically, the first conductive layer 15 is disposed so as to cover the first end surface 10e or the second end surface 10f and reach the first and second principal surfaces 10a and 10b and the first and second side surfaces 10c and 10d. Herein, the first conductive layer 15 may be disposed only on the first end surface 10e or the second end surface 10f.

The thickness of the first conductive layer 15 is, for example, preferably about 5.0 µm to about 70.0 µm.

The second conductive layer 16 is disposed on the first conductive layer 15. The first conductive layer 15 is substantially covered with the second conductive layer 16. The second conductive layer 16 is preferably composed of a plating film. The second conductive layer 16 may be composed of a single plating film or a laminated body of multiple plating films. Specifically, the second conductive layer 16 is disposed on the first conductive layer 15 and may be composed of a laminated body of a Ni plating layer that also serves as a barrier layer and a plating layer that is disposed on the Ni plating layer and contains Sn or Au, which has good wettability. The thickness of each of the plating layers constituting the second conductive layer 16 is, for example, preferably about 1 µm to about 15 µm.

The first conductive layer 15 contains a first metal component, a second metal component, and a resin. Since the first conductive layer 15 contains a resin, it is more flexible than a conductive layer composed of, for example, a plating film or a fired product of conductive paste. Therefore, even if the ceramic electronic component 1 is subjected to physical impact or a shock caused by a thermal cycle, the first conductive layer 15 functions as a shock absorbing layer. Thus, the ceramic electronic component 1 is not easily damaged and solder used to mount the ceramic electronic component 1 is also not easily damaged.

Preferred examples of the resin added to the first conductive layer 15 include thermosetting resins such as an epoxy resin and a phenolic resin.

The content of the resin in the first conductive layer 15 after curing is preferably about 46% to about 77% by volume, for example.

The melting point of the first metal component is relatively low and the melting point of the second metal component is relatively high. The melting point of the first metal component is, for example, preferably about 550° C. or lower and more preferably about 180° C. to about 340° C. The melting point of the second metal component is, for example, preferably about 850° C. to about 1050° C.

The first metal component is preferably composed of, for example, Sn, In, or Bi or an alloy containing at least one of the foregoing metals. In particular, the first metal component is more preferably composed of Sn or an alloy containing Sn. Examples of the alloy containing Sn include Sn—Ag, Sn—Bi, and Sn—Ag—Cu.

The content of the first metal component in the first conductive layer 15 after curing is preferably about 8% to about 18% by volume, for example.

The second metal component is preferably composed of, for example, a metal such as Ag, Pd, Pt, or Au or an alloy containing at least one of the foregoing metals. In particular, the second metal component is more preferably composed of Ag or a Ag alloy such as a Ag—Pd alloy.

The content of the second metal component in the first conductive layer 15 after curing is preferably about 19% to about 25% by volume, for example.

The first conductive layer 15 includes a metal layer 15a and a conductive layer 15b.

The metal layer 15a is located on the surface of the ceramic body 10. Specifically, the metal layer 15a is disposed directly on the first end surface 10e or the second end surface 10f. The metal layer 15a is a layer composed of an alloy containing the first and second metal components and the metal components contained in the first inner electrode 25 or the second inner electrode 26. The metal layer 15a substantially does not contain a resin.

The conductive layer 15b is disposed on the metal layer 15a. The conductive layer 15b covers the metal layer 15a. The conductive layer 15b contains first and second metal components and a resin. In the conductive layer 15b, the first and second metal components are disposed in a resin matrix, and the first and second metal components provide conductivity of the conductive layer 15b. The first and second metal components may be alloyed with each other.

The metal layer 15a includes a first portion 15a1 and a second portion 15a2. The first portion 15a1 is located on the end portion of the first inner electrode 25 or the second inner electrode 26. The first portion 15a1 contains the metal contained in the first inner electrode 25 or the second inner electrode 26 and the first metal component having a low melting point. In the first portion 15a1, the metal contained in the first inner electrode 25 or the second inner electrode 26 is alloyed with the first metal component having a low melting point. The first portion 15a1 can be composed of, for example, a Sn—Ni alloy, a Sn—Cu alloy, a Sn—Ag alloy, a Sn—Pd alloy, a Sn—Ag—Pd alloy, a Sn—Pt alloy, a Sn—Au alloy, an In—Ni alloy, an In—Cu alloy, an In—Ag alloy, an In—Pd alloy, an In—Ag—Pd alloy, an In—Pt alloy, an In—Au alloy, a Bi—Ni alloy, a Bi—Cu alloy, a Bi—Ag alloy, a Bi—Pd alloy, a Bi—Ag—Pd alloy, a Bi—Pt alloy, or a Bi—Au alloy. For example, in the case where the first and second inner electrodes 25 and 26 contain Ni and the first metal component contains Sn, the first portion 15a1 preferably contains a Sn—Ni alloy.

The second portion 15a2 connects adjacent first portions 15a1 to each other. The second portion 15a2 contains the first metal component having a low melting point and the second metal component having a high melting point. In the second portion 15a2, the first metal component having a low melting point is alloyed with the second metal component having a high melting point. The second portion 15a2 can be composed of, for example, a Sn—Ag alloy, a Sn—Ni—Ag alloy, a Sn—Cu—Ag alloy, a Sn—Pd alloy, a Sn—Ag—Pd alloy, or a Sn—Au alloy. For example, in the case where the first metal component contains Sn and the second metal component contains Ag, the second portion 15a2 preferably contains a Ag—Sn alloy or a Sn—Ni—Ag alloy.

The length of the second portion 15a2 in the thickness direction is preferably substantially equal to the thickness of the ceramic layer 10g. The length is, for example, preferably about 0.3 μm to about 10 μm.

An oxide film (e.g., SnO) of the first metal component may be formed between the second portion 15a2 and the first end surface 10e or the second end surface 10f.

The second portion 15a2 is not necessarily formed in at least one of portions between adjacent first portions 15a1. In other words, a plurality of first portions 15a1 are not necessarily completely integrated with each other by the second portion 15a2.

A portion of the first portion 15a1 enters the inside of the ceramic body 10, and is electrically connected to the first inner electrode 25 or the second inner electrode 26 inside the ceramic body 10. That is, the first portion 15a1 includes a protruding portion 15a11 that extends into the ceramic body 10. A portion of the first portion 15a1 other than the protruding portion 15a11 is wider than the protruding portion 15a11. The length of the first portion 15a1 in the length direction L is, for example, preferably about 2.4 μm to about 9.6 μm.

A non-limiting example of a method for producing the ceramic electronic component 1 will now be described.

First, a ceramic body 10 including first and second inner electrodes 25 and 26 is prepared. Specifically, a ceramic paste containing a ceramic powder is applied in a sheet-shaped configuration by screen printing or other suitable process and then dried to produce a ceramic green sheet. Subsequently, a conductive paste for forming inner electrodes is applied on the ceramic green sheet in a predetermined pattern by screen printing or other suitable process. Thus, a ceramic green sheet on which a conductive pattern for forming inner electrodes has been formed and a ceramic green sheet on which a conductive pattern for forming inner electrodes is not formed are prepared. Note that a publicly known binder or solvent may be contained in the ceramic paste and the conductive paste for forming inner electrodes.

Next, a predetermined number of ceramic green sheets on which a conductive pattern for forming inner electrodes is not formed are stacked on top of each other. Ceramic green sheets on which a conductive pattern for forming inner electrodes has been formed are stacked thereon successively. A predetermined number of ceramic green sheets on which a conductive pattern for forming inner electrodes is not formed are further stacked thereon. As a result, a mother stack is produced. The mother stack may be optionally subjected to pressing in the stacking direction by isostatic pressing or other suitable process.

The mother stack is then cut into a plurality of green ceramic bodies each having a predetermined shape and size. The green ceramic bodies may be subjected to barrel polishing to round the ridge lines and corners thereof.

Next, by firing each of the green ceramic bodies, a ceramic body 10 is completed that includes first and second inner electrodes 25 and 26 disposed inside the ceramic body 10 and in which the end portions of the first and second inner electrodes 25 and 26 are led to the first and second end surfaces 10e and 10f, respectively. The firing temperature of the green ceramic bodies can be suitably set in accordance with the ceramic material and conductive material used. The firing temperature of the green ceramic bodies can be, for example, about 900° C. to about 1300° C.

A paste for forming outer electrodes is then prepared that contains a resin 17c such as a thermosetting resin, a first metal filler 17a containing a first metal component, and a second metal filler 17b containing a second metal component having a higher melting point than the first metal component.

In this paste, the content of the first metal filler 17a relative to the total weight of the first metal filler 17a, the second metal filler 17b, and the resin 17c is preferably about 20% to about 40% by weight and more preferably about 22.0% to about 37.2% by weight, for example. If the content of the first metal filler 17a is excessively low, a metal layer 15a is sometimes not sufficiently formed. If the content of the first metal filler 17a is excessively high, the amount of first metal filler 17a that does not react with the second metal filler 17b and is left in outer electrodes 13 and 14 increases. As a result, the outer electrodes 13 and 14 may be deformed, for example, due to heat applied during reflowing.

The shape of the first metal filler 17a is not particularly limited. The first metal filler 17a may have a spherical shape, a flat shape, or other suitable shape, for example.

The average particle size of the first metal filler 17a is not particularly limited and may be, for example, about 1.0 μm to about 10 μm.

In this paste, the content of the second metal filler 17b relative to the total weight of the first metal filler 17a, the second metal filler 17b, and the resin 17c is preferably about 30% to about 70% by weight and more preferably about 41.2% to about 64% by weight, for example. If the content of the second metal filler 17b is excessively low, the conductivity of the outer electrodes 13 and 14 decreases and the equivalent series resistance (ESR) of the ceramic electronic component 1 may increase. If the content of the second metal filler 17b is excessively high, the content of the resin 17c in the outer electrodes 13 and 14 excessively decreases. As a result, the stress relaxation effect of the outer electrodes 13 and 14 may excessively degrade.

The shape of the second metal filler 17b is not particularly limited. The second metal filler 17b may have a spherical shape, a flat shape, or other suitable shape, for example.

The average particle size of the second metal filler 17b is not particularly limited and may be, for example, about 0.5 μm to about 5.0 μm.

In this paste, the content of the resin 17c relative to the total weight of the first metal filler 17a, the second metal filler 17b, and the resin 17c is preferably about 5% to about 40% by weight and more preferably about 9.8% to about 31.5% by weight, for example. If the content of the resin 17c is excessively low, the stress relaxation effect of the outer electrodes 13 and 14 excessively degrade and thus impacts generated when stress is applied from the outside are sometimes not sufficiently absorbed by the outer electrodes 13 and 14. If the content of the resin 17c is excessively high, the conductivity of the outer electrodes 13 and 14 decreases and the equivalent series resistance (ESR) of the ceramic electronic component 1 may increase.

Figure 6:
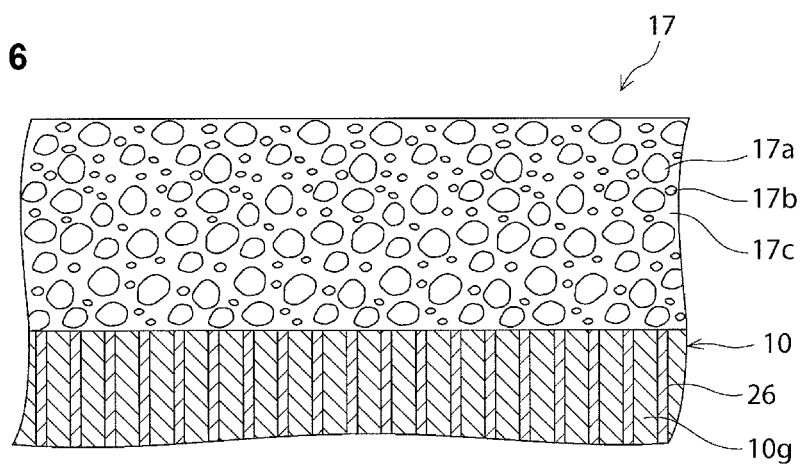
FIG. 6 is a schematic sectional view for describing the production process of the ceramic electronic component according to a preferred embodiment of the present invention.

As shown in FIG. 6, an electrode layer 17 is then formed by applying the above-described paste onto the surface of the ceramic body 10. The paste can be applied by various printing methods or a dipping method.

Next, the electrode layer 17 is heated. The heating temperature of the electrode layer 17 is preferably higher than or equal to a temperature (temperature range in which the diffusion of the first metal component to the outside of the electrode layer 17 is facilitated) at which the crystalline state of an alloy of the first metal component and the second metal component changes thermodynamically. The heating temperature of the electrode layer 17 is, for example, preferably about 480° C. or higher. The electrode layer 17 is preferably heated in a non-oxidative atmosphere, e.g., a reducing atmosphere or a neutral atmosphere such as a nitrogen gas atmosphere. The electrode layer 17 is preferably heated in an atmosphere whose oxygen concentration is about 100 ppm or less, for example. By heating the electrode layer 17 to such a high temperature, a first conductive layer 15 including a metal layer 15a and a conductive layer 15b is formed. Herein, the metal layer 15a is located on the surface of the ceramic body 10 and contains the first and second metal components and the metal contained in the inner electrodes 25 and 26. The conductive layer 15b contains the first and second metal components and the resin 17c. Furthermore, a first portion 15a1 and a second portion 15a2 are formed in the metal layer 15a. Herein, the first portion 15a1 is located on the inner electrodes 25 and 26, contains the first metal component and the metal contained in the inner electrodes 25 and 26, and includes a protruding portion 15a11 extending into the ceramic body 10. The second portion 15a2 connects adjacent first portions 15a1 to each other and contains the first metal component and the second metal component.

If the heating temperature of the electrode layer 17 is excessively high, the conductive layer 15b containing the resin 17c is sometimes not suitably formed. Thus, the heating temperature of the electrode layer 17 is preferably lower than about 800° C. and more preferably about 650° C. or lower.

Finally, by forming a second conductive layer 16 by a plating method or other suitable process, a ceramic electronic component 1 can be completed.

As described above, since the outer electrodes 13 and 14 contain the resin 17c in this preferred embodiment, the ceramic electronic component 1 is excellent in terms of impact resistance and resistance to a thermal cycle. In addition, the outer electrodes 13 and 14 are located on the surface of the ceramic body 10 and include the metal layer 15a containing the first metal component and the second metal component. This metal layer 15a covers the exposed portions of the inner electrodes 25 and 26. Therefore, the ceramic electronic component 1 has high moisture resistance. That is, the ceramic electronic component 1 has high impact resistance and resistance to a thermal cycle and high moisture resistance.

Since the metal layer 15a includes the protruding portion 15a11 extending into the ceramic body 10, higher moisture resistance is achieved.

It is also expected that the first metal component and the second metal component diffuse into the ceramic body 10 and thus cracks formed in the ceramic body 10 are repaired, whereby the rigidity and moisture resistance of the ceramic body 10 are further improved.

Preferred embodiments of the present invention will now be further described in detail based on specific non-limiting experimental examples. However, the present invention is not limited by the experimental examples below and may be modified without departing from the scope of the present invention.

Figure 7:
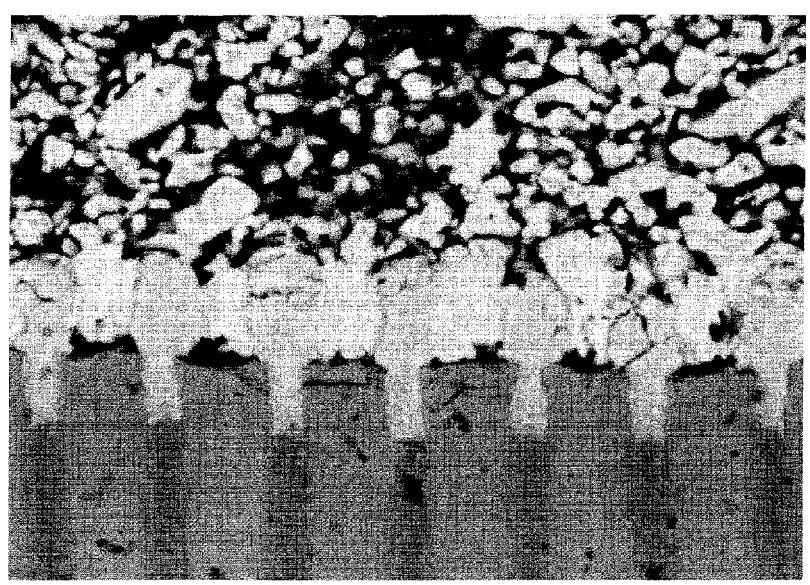
FIG. 7 is a photograph showing a partially enlarged cross section of a ceramic electronic component prepared in Experimental Example 5. More specifically.

Ceramic electronic components each having the same structure as that of the ceramic electronic component 1 according to the above-described preferred embodiment were prepared under the conditions below. For each of the conditions, 72 ceramic electronic components were prepared. Subsequently, a humidity test was performed under the conditions below. Table 1 shows the results. FIG. 7 is a photograph showing a partially enlarged cross section of a ceramic electronic component prepared in Experimental Example 5.

Size of ceramic body 10: 1.0 mm×0.5 mm×0.5 mm
Ceramic material: $BaTiO_3$
Thickness of ceramic layer 10g: 1.90 μm
Material of inner electrodes 25 and 26: Ni
Thickness of inner electrodes 25 and 26: 0.61 μm
Number of inner electrodes 25 and 26: 156
Distance from outermost inner electrode to principal surface (thickness of outer layer on one side): 60 μm
Resin 17c: thermosetting epoxy resin
Content of first metal filler relative to the total amount of first metal filler, second metal filler, and resin 17c: 25.6% by weight
Content of second metal filler relative to the total amount of first metal filler, second metal filler, and resin 17c: 60% by weight
Content of resin 17c relative to the total amount of first metal filler, second metal filler, and resin 17c: 14.4% by weight
Heat treatment atmosphere: nitrogen gas atmosphere
Heat treatment time: 18 minutes
Heat treatment temperature: shown in Table 1
Second conductive layer 16: laminated body of Ni plating layer and Sn plating layer (Sn plating layer forms an outermost layer)

In Experimental Example 1, the first portion was partially formed and the second portion was not formed.

The ceramic electronic components were left to stand in a high temperature and high humidity oven at 40° C. and 95% RH for 1000 hours while a voltage of 6.3 V was applied. After that, the insulation resistance was measured at room temperature. Ceramic electronic components having an insulation resistance of less than 5 Ω·F were defined as poor samples, and the number of poor samples were counted.

TABLE 1

| | Heat treatment temperature | Metal layer | Humidity test (number of poor samples/number of samples) |
| --- | --- | --- | --- |
| Experimental Example 1 | 450° C. | Not formed | 5/72 |
| Experimental Example 2 | 480° C. | Formed | 0/72 |
| Experimental Example 3 | 500° C. | Formed | 0/72 |
| Experimental Example 4 | 520° C. | Formed | 0/72 |
| Experimental Example 5 | 550° C. | Formed | 0/72 |
| Experimental Example 6 | 600° C. | Formed | 0/72 |

As is clear from the results shown in Table 1, the moisture resistance is improved by forming the metal layer 15a. In addition to the Experimental Examples shown in Table 1, an experiment was performed at a heat treatment temperature of 800° C. However, in this experiment, the resin 17c was scattered and thus the outer electrodes substantially did not contain the resin 17c.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for producing a ceramic electronic component, the method comprising:
    a step of preparing a ceramic body that includes an inner electrode disposed inside the ceramic body and in which an end portion of the inner electrode extends to a surface of the ceramic body;
    a step of forming an electrode layer on the surface of the ceramic body so as to cover the end portion of the inner electrode, the electrode layer including a resin, a first metal filler that contains a first metal component, and a second metal filler that contains a second metal component having a higher melting point than the first metal component; and
    a step of heating the electrode layer to form an electrode including a metal layer that is located on the surface of the ceramic body and that includes the first and second metal components and a metal contained in the inner electrode; wherein
    in the step of heating, the electrode layer is heated so that the metal layer includes a first portion that is located on the inner electrode and that contains the first metal component and the metal contained in the inner electrode and a second portion that connects adjacent first portions to each other and that contains the first metal component and the second metal component; and
    a heating temperature of the heating step thermodynamically changes a crystalline state of an alloy including the first metal component and the second metal component.

2. The method for producing a ceramic electronic component according to claim 1, wherein, in the step of heating, the electrode layer is heated to about 480° C. or higher in a non-oxidative atmosphere.

3. The method for producing a ceramic electronic component according to claim 1, wherein, in the step of heating, the electrode layer is heated to a temperature of lower than about 800° C.

4. The method for producing a ceramic electronic component according to claim 1, wherein, in the step of heating, the electrode layer is heated so that the metal layer includes a protruding portion extending into the ceramic body.

5. The method for producing a ceramic electronic component according to claim 1, wherein the first metal component contains Sn and the second metal component contains Ag.

6. The method for producing a ceramic electronic component according to claim 1, wherein the first portion contains a Sn—Ni alloy and the second portion contains a Ag—Sn alloy.

7. The method for producing a ceramic electronic component according to claim 1, wherein the inner electrode contains Ni.

* * * * *